United States Patent
Sancon

(10) Patent No.: US 12,014,775 B2
(45) Date of Patent: Jun. 18, 2024

(54) WRITE ERROR COUNTER FOR MEDIA MANAGEMENT IN A MEMORY DEVICE

(71) Applicant: Micron Technology, Inc., Boise, ID (US)

(72) Inventor: John Christopher M. Sancon, Boise, ID (US)

(73) Assignee: Micron Technology, Inc., Boise, ID (US)

( * ) Notice: Subject to any disclaimer, the term of this patent is extended or adjusted under 35 U.S.C. 154(b) by 124 days.

(21) Appl. No.: 17/732,353

(22) Filed: Apr. 28, 2022

(65) Prior Publication Data

US 2023/0352086 A1 Nov. 2, 2023

(51) Int. Cl.
*G11C 13/00* (2006.01)

(52) U.S. Cl.
CPC ...... *G11C 13/0035* (2013.01); *G11C 13/0004* (2013.01); *G11C 13/004* (2013.01); *G11C 13/0064* (2013.01); *G11C 13/0069* (2013.01)

(58) Field of Classification Search
CPC ............ G11C 13/0004; G11C 13/0033; G11C 13/004; G11C 13/0061; G11C 13/0069; G11C 2013/0073; G11C 2213/71; G11C 11/40615; G11C 11/4074; G11C 11/4076; G11C 11/409; G11C 13/0023; G11C 13/003; G11C 11/406; G11C 13/0097; G11C 2013/0045; G11C 2013/0076; G11C 2013/0078

See application file for complete search history.

(56) References Cited

U.S. PATENT DOCUMENTS

2021/0312976 A1* 10/2021 Pellizzer ........... G11C 11/40615

* cited by examiner

*Primary Examiner* — Thong Q Le
(74) *Attorney, Agent, or Firm* — Greenberg Traurig

(57) ABSTRACT

Systems, methods, and apparatus related to memory devices. In one approach, a memory device includes a sense amplifier, a counter, and memory having memory cells. Access lines are used to select the memory cells for performing write operations. The memory device includes a controller to control the applying of a voltage to the memory cell. The voltage is applied during a write operation using the access lines. The sense amplifier is used to determine whether the memory cell reaches a threshold state or snaps. In response to determining that the memory cell does not snap, a write error count is incremented using the counter. The controller reads the counter to determine the write error count, and based on the write error count, the controller performs one or more media management or memory device control actions.

31 Claims, 12 Drawing Sheets

WRITE ERROR COUNTER FOR MEDIA MANAGEMENT IN A MEMORY DEVICE

FIELD OF THE TECHNOLOGY

At least some embodiments disclosed herein relate to memory systems in general, and more particularly, but not limited to write error counters used for media management and/or control of operation in a memory device.

BACKGROUND

Memory devices are widely used to store information in various electronic devices such as computers, wireless communication devices, cameras, digital displays, and the like. Information is stored by programming different states of a memory device. For example, binary devices have two states, often denoted by a logic "1" or a logic "0." In other systems, more than two states may be stored. To access the stored information, a component of the electronic device may read, or sense, the stored state in the memory device. To store information, a component of the electronic device may write, or program, the state in the memory device.

Various types of memory devices exist, including magnetic hard disks, random access memory (RAM), read only memory (ROM), dynamic RAM (DRAM), synchronous dynamic RAM (SDRAM), ferroelectric RAM (FeRAM), magnetic RAM (MRAM), resistive RAM (RRAM), flash memory, phase change memory (PCM), and others. Memory devices may be volatile or non-volatile. Non-volatile memory cells may maintain their stored logic state for extended periods of time even in the absence of an external power source. Volatile memory cells may lose their stored state over time unless they are periodically refreshed by an external power source.

A storage device is an example of a memory device. Typical computer storage devices have controllers that receive data access requests from host computers and perform programmed computing tasks to implement the requests in ways that may be specific to the media and structure configured in the storage devices. In one example, a memory controller manages data stored in memory and communicates with a computer device. In some examples, memory controllers are used in solid state drives for use in mobile devices or laptops, or media used in digital cameras.

Firmware can be used to operate a memory controller for a particular storage device. In one example, when a computer system or device reads data from or writes data to a memory device, it communicates with the memory controller.

Memory devices typically store data in memory cells. In some cases, memory cells exhibit non-uniform, variable electrical characteristics that may originate from various factors including statistical process variations, cycling events (e.g., read or write operations on the memory cells), or a drift (e.g., a change in resistance of a chalcogenide alloy), among others.

In one example, reading a set of data (e.g., a codeword, or a page) is carried out by determining a read voltage (e.g., an estimated median of threshold voltages) of memory cells that store the set of data. In some cases, a memory device may include an array of PCM cells arranged in a 3D architecture, such as a cross-point architecture to store the set of data. PCM cells in a cross-point architecture may represent a first logic state (e.g., a logic 1, a SET state) associated with a first set of threshold voltages, or a second logic state (e.g., a logic 0, a RESET state) associated with a second set of threshold voltages. In some cases, data may be stored using encoding (e.g., error correction coding (ECC)) to recover data from errors in the data stored in the memory cells.

For resistance variable memory cells (e.g., PCM cells), one of a number of states (e.g., resistance states) can be set. For example, a single level cell (SLC) may be programmed to one of two states (e.g., logic 1 or 0), which can depend on whether the cell is programmed to a resistance above or below a particular level. As an additional example, various resistance variable memory cells can be programmed to one of multiple different states corresponding to multiple data states, e.g., 10, 01, 00, 11, 111, 101, 100, 1010, 1111, 0101, 0001, etc. Such cells may be referred to as multi state cells, multi-digit cells, and/or multi-level cells (MLCs).

The state of a resistance variable memory cell can be determined (e.g., read) by sensing current through the cell responsive to an applied interrogation voltage. The sensed current, which varies based on the resistance of the cell, can indicate the state of the cell (e.g., the binary data stored by the cell). The resistance of a programmed resistance variable memory cell can drift (e.g., shift) over time. Resistance drift can result in erroneous sensing of a resistance variable memory cell (e.g., a determination that the cell is in a state other than that to which it was programmed, among other issues).

A PCM cell, for example, may be programmed to a reset state (amorphous state) or a set state (crystalline state). A reset pulse (e.g., a pulse used to program a cell to a reset state) can include a relatively high current pulse applied to the cell for a relatively short period of time such that the phase change material of the cell melts and rapidly cools, resulting in a relatively small amount of crystallization. Conversely, a set pulse (e.g., a pulse used to program a cell to a set state) can include a relatively lower current pulse applied to the cell for a relatively longer time interval and with a slower quenching speed, which results in an increased crystallization of the phase change material.

A programming signal can be applied to a selected memory cell to program the cell to a target state. A read signal can be applied to a selected memory cell to read the cell (e.g., to determine the state of the cell). The programming signal and the read signal can be current and/or voltage pulses, for example.

BRIEF DESCRIPTION OF THE DRAWINGS

The embodiments are illustrated by way of example and not limitation in the figures of the accompanying drawings in which like references indicate similar elements.

DETAILED DESCRIPTION

Figure 1:
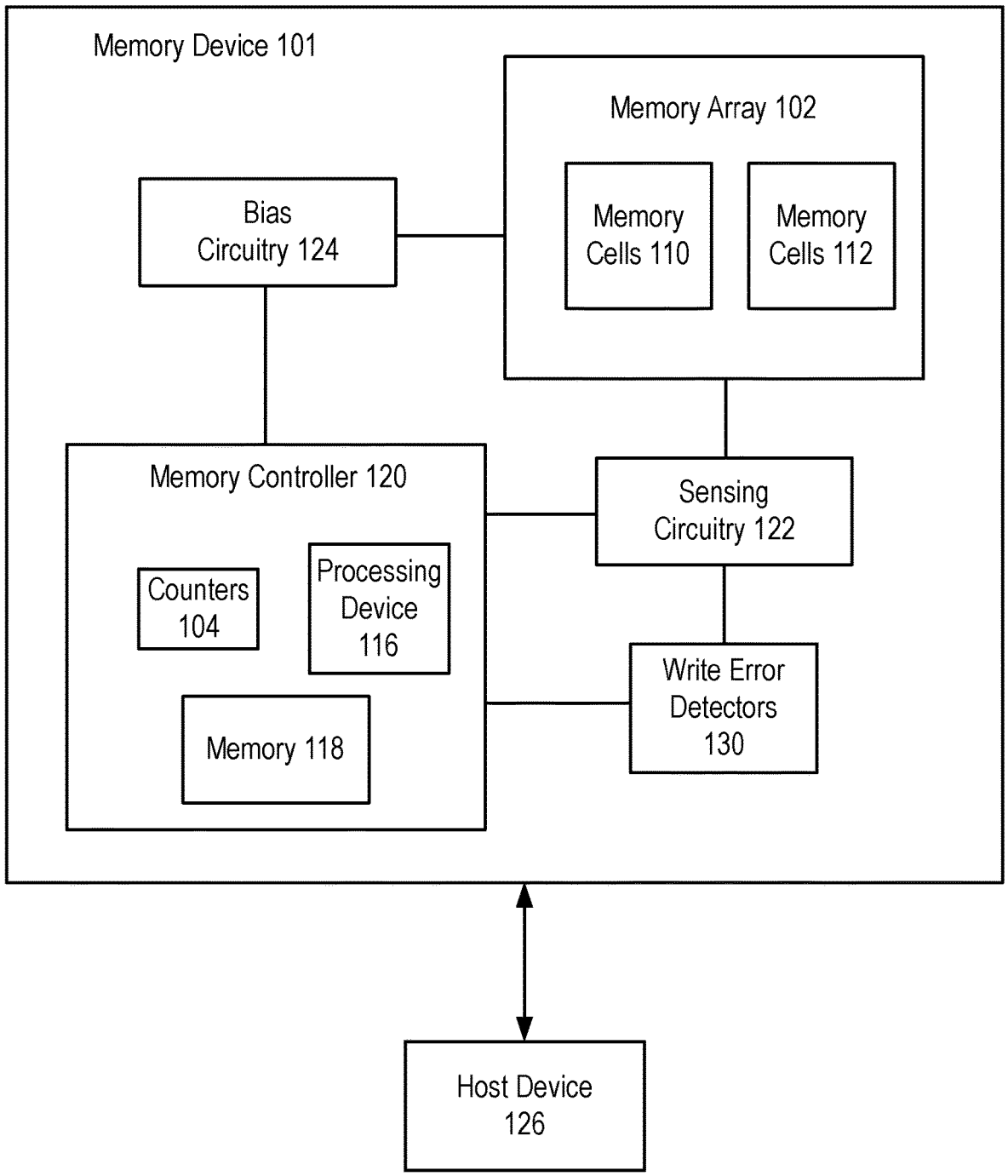
FIG. 1 shows a memory device that uses write error detectors for detecting errors when performing write operations for memory cells in a memory array, in accordance with some embodiments.

The following disclosure describes various embodiments for write error counters that count errors during write operations performed on memory cells in a memory device. In some embodiments, the error count is read from one or more registers by a controller and used for controlling media management and/or operation of the memory device.

At least some embodiments herein relate to memory devices that use bipolar operations for a memory array. In one example, bipolar select voltages are used to select memory cells of the memory array. In one example, the memory cells are arranged in a cross-point architecture (e.g., two-dimensional or three-dimensional). In one example, each memory cell is formed using a single select device. In one example, the select device includes a chalcogenide material that snaps or thresholds when a sufficient voltage is applied across the memory cell. In other embodiments, other phase change memory cells can be used in which the memory cell thresholds when a sufficient voltage is applied across the cell.

The memory device may, for example, store data used by a host device (e.g., a computing device of an autonomous vehicle, or another computing device that accesses data stored in the memory device). In one example, the memory device is a solid-state drive mounted in an electric vehicle.

In some cases, a memory device may include an array of memory cells arranged in a three-dimensional (3D) architecture, such as a cross-point architecture, to store the set of data. The memory cells in a cross-point architecture may, for example, represent a first logic state (e.g., a logic 1, a SET state) associated with a first set of threshold voltages, or a second logic state (e.g., a logic 0, a RESET state) associated with a second set of threshold voltages.

In other embodiments, the memory cells may be arranged in a three-dimensional (3D) vertical architecture. A 3D vertical architecture may include memory cells located at the crossing between a vertical access line (e.g., a bitline pillar), and each one of a plurality of second access lines (e.g., wordlines), formed in horizontal planes or decks parallel to each other.

More generally, an integrated circuit memory cell, such as a memory cell in a cross-point memory or a 3D vertical array, can be programmed to store data by the way of its state at a voltage applied across the memory cell. For example, if a memory cell is configured or programmed in such a state that allows a substantial current to pass the memory cell at a voltage in a predefined voltage region, the memory cell is considered to have been configured or programmed to store a first bit value (e.g., one or zero); and otherwise, the memory cell is storing a second bit value (e.g., zero or one).

Optionally, a memory cell can be configured or programmed to store more than one bit of data by being configured or programmed, for example, to have a threshold voltage in one of more than two separate voltage regions.

The threshold voltage of a memory cell is such that when the voltage applied across the memory cell is increased to above the threshold voltage, the memory cell changes rapidly or abruptly, snaps (e.g., for a chalcogenide memory cell), or changes (e.g., jumps) from a non-conductive state to a conductive state. The non-conductive state allows a small leak current to go through the memory cell; and in contrast, the conductive state allows more than a threshold amount of current to go through. Thus, a memory device can use a sensor (e.g., sense amplifier) to detect the change, or determine the conductive/non-conductive state of the memory device at one or more applied voltages, to evaluate or classify the level of the threshold voltage of the memory cell and thus its stored data.

The threshold voltage of a memory cell can be configured/programmed to be in different voltage regions used to represent different data values stored in the memory cell. For example, the threshold voltage of the memory cell can be programmed to be in any of four predefined voltage regions; and each of the regions can be used to represent the bit values of a different two-bit data item. Thus, when given a two-bit data item, one of the four voltage regions can be selected based on a mapping between two-bit data items and voltage regions; and the threshold voltage of the memory cell can be adjusted, programmed, or configured to be in the selected voltage region to represent or store the given two-bit data item. To retrieve, determine, or read the data item from the memory cell, one or more read voltages can be applied across the memory cell to determine which of the four voltage regions contain the threshold voltage of the memory cell. The identification of the voltage region that contains the threshold voltage of the memory cell provides the two-bit data item that has been stored, programmed, or written into the memory cell.

For example, a memory cell can be configured or programmed to store a one-bit data item in a Single Level Cell (SLC) mode, or a two-bit data item in a Multi-Level Cell (MLC) mode, or a three-bit data item in a Triple Level Cell (TLC) mode, or a four-bit data item in a Quad-Level Cell (QLC) mode.

For certain types of memory cells (e.g., chalcogenide or other phase change memory cells), when performing a write operation on a memory cell, it is necessary that the cell snaps or thresholds. In one example, the write voltage must exceed the E4 edge of the reset normal quantile distribution for chalcogenide-based memory cells in order to avoid a failure to snap of those cells having higher threshold voltages. If a cell does not snap or threshold, the write operation will not be successful. For example, unless the memory cell has snapped (and is conductive), write voltage waveforms applied to the cell will not impart the proper phase characteristics to the cell (e.g., change the state of the cell to a set or reset state).

In some cases, as memory cells age, the cells will fail to snap or threshold. For example, memory cells at the E4 edge may fail to threshold, even when using drift cancellation. This causes a write error.

More generally, the threshold voltage of a memory cell can change or drift over a period of time, usage, and/or write/read operations, and in response to certain environmental factors, such as temperate extremes, cycling, etc. The rate of change or drift can increase as the memory cell ages. The change or drift can result in errors when writing data to the memory cell. For example, some memory cells wear out through extensive cycling, and will fail to snap thus causing a write error.

In some cases, the write failure occurs because the reset curve cannot be restored to an original voltage distribution position after drifting (e.g., drift cancellation is inadequate). For example, after numerous programming cycles, the cell is no longer able to be fully restored. It is not possible to know whether the cell can be fully restored or not as the wear on the memory cell varies from cell to cell. The only time that the controller learns that the write was not successful is when the controller does the next read of the cell.

A technical problem with the above write failures is that the error is not detected until a later time after the write operation has been done. For example, the controller does not check for the above write errors during the write operation, so the error is typically not detected until a later read operation (e.g., days or months later). For example, during this later read, a read error occurs because one or more cells were not previously properly written. Further, it is often not clear whether the read error is due to a prior write failure, or due to a current failure with the read operation itself.

To address these and other technical problems, write errors are detected by a controller during the write operation itself. In this way, the controller can know in real-time during the write operation whether the write operation for a memory cell has been successful or not. Based on the write error detection, the controller can perform one or more timely actions in response, as may be desired or appropriate for a given operating context of the memory device at the time of failure. For example, if the controller detects a write error for a given memory cell, the controller can increase the write voltage(s) and/or length of the write time period(s) to compensate. This compensation can be for the failing cell, for cells in a same region or block, and/or for cells having similar characteristics (e.g., a similar electrical distance from a driver). The compensation can be for a current write operation and/or a future write operation.

In one embodiment, a solid-state drive or other storage device includes a counter, a memory array having memory cells, and a controller. The controller applies, during a write operation, a first pulse to a memory cell in the memory array. After applying the first pulse, the controller applies a second pulse to the memory cell. The controller determines whether the memory cell snaps due to applying the second pulse (e.g., using a sense amplifier coupled to detect a current through the cell). In response to determining that the memory cell does not snap due to applying the second pulse, the controller increments a count of write errors using the counter. The controller determines whether the count has reached a threshold. In response to determining that the count has reached the threshold, the controller performs one or more actions associated with the memory array. For example, the actions may include refreshing the memory cell, retrying the write operation, wear leveling, block retirement, and/or write cycle binning (e.g., increasing selection voltage for one or more bins).

As used herein, a pulse as applied to a memory cell includes, for example, the application of a voltage across the terminals of a two-terminal memory cell. In one example, a positive voltage is applied to a first terminal connected to a bitline, and a negative voltage is applied to a second terminal connected to a wordline.

In one example, snap detection for chalcogenide memory cells is performed during a write operation using a sense amplifier. Write errors are detected for each cell or a group of cells. The write errors are written as error count values into one or more registers. The controller can periodically check the value in the register(s) to determine whether to take action. For example, the controller can check the registers every given number of write cycles for a cell, or region of memory, or group of cells. For example, the controller can check the registers after a defined change in temperature and/or length of time has passed (e.g., after 1-10 hours, days, or years have passed).

The controller can also use data collected from sensors of a memory device as a basis for determining when to check the registers. The sensor data can include temperature data.

In one embodiment, the sensor data and/or data regarding write and/or read errors can be provided as input to a machine learning model, and the output can be used to determine whether to check write error registers.

In one embodiment, the electrical distance from a driver to a memory cell is used as a basis for determining whether to perform the write error detection above. In one example, the write error detection is only enabled for cells having a defined electrical distance. For example, the electrical distance may be determined to exceed a threshold, or cells in a defined address range may be considered to have a greater electrical distance than other cells so that write error detection is enabled.

In one example, write error detection is performed for far cells, but not for near cells. After cells have been extensively cycled, the cells become more leaky. Thus, the voltage applied to a far cell can be lower than the voltage applied to a near cell.

FIG. 1 shows a memory device 101 that uses write error detectors 130 for detecting errors when performing write operations for memory cells 110, 112 in a memory array 102, in accordance with some embodiments. Memory device 101 applies voltages to memory cells 110, 112 when performing write operations. In one example, cells 110 are near cells and cells 112 are far cells.

Memory device 101 has a memory controller 120 that controls the applied voltages. Memory controller 120 includes one or more processing devices 116 and memory 118. In one example, memory 118 stores firmware executed by processing device 116 to apply write voltages (e.g., a series of pulses).

Memory controller 120 can use bias circuitry 124 to generate voltages for applying write and other voltages. For example, bias circuitry 124 generates voltage waveforms for applying write voltages to memory cells 110, 112 as part of programming operations. In some cases, bias circuitry 124 may also be used to generate read voltages for read operations performed on memory array 102 (e.g., in response to a read command from host device 126).

Memory device 101 includes sensing circuitry 122, which is used to sense a state of each memory cell in memory array 102. In one example, sensing circuitry 122 includes sense amplifiers used to detect a current caused by applying various voltages to memory cells in memory array 102. In one example, bias circuitry 124 applies a write voltage to memory cells 110. Sensing circuitry 122 senses a current associated with each of the memory cells 110 caused by applying the write voltage to determine if the cell has snapped.

In one example, if sensing circuitry 122 determines that the current for a memory cell is greater than a fixed threshold (e.g., a predetermined level of current), then memory controller 120 determines that the memory cell has snapped.

In one embodiment, memory cells 110 and memory cells 112 correspond to different memory types (e.g., single level cell, or multi-level cell). In one example, the material used to form a select device of each memory cell is different. The write voltage applied to memory cells 110 corresponds to the material used to form memory cells 110.

In one embodiment, the controller 120 determines whether to perform write error detection for memory cells of memory array 102 based on a physical location of the memory cells in the memory array 102. In one example, the physical location is a distance from a row and/or column decoder (e.g., the location can be stored in a look-up table in memory 118). In one example, the physical location corresponds to a region of memory exhibiting an increased extent of drift or disturb (e.g., as determined from testing during manufacture, and/or sensor or other data during operation). In one embodiment, electrical distance can be additionally and/or alternatively used.

In one embodiment, the controller 120 determines to enable write error detection for memory cells of memory array 102 at least in part based on a level of voltage biases that have previously been applied to particular memory cells in the memory array 102.

In one embodiment, memory controller 120 receives a write command from a host device 126. The write command is accompanied by data (e.g., user data of a user of host device 126) to be written to memory array 102. In response to receiving the write command, controller 120 initiates a write operation.

In one embodiment, controller 120 uses one of counters 104 to count the number of memory cells that snap during a write operation (e.g., when writing 128 cells at a common wordline address). Data stored in counters 104 can be used for media management or controlling actions taken by controller 120.

In one example, controller 120 uses write voltages (e.g., write pulses) to write a logic state to a memory cell, such as memory cell 110, 112 during a write operation. The write pulses may be applied by providing a first voltage to a bitline and providing a second voltage to a wordline to select the memory cell. Circuits coupled to access lines to which memory cells may be coupled may be used to provide the write voltages (e.g., access line drivers included in decoder circuits). The circuits may be controlled by internal control signals provided by a control logic (e.g., controller 120). The resulting voltage applied to the memory cell is the difference between the first and second voltages. The write pulses may be the same duration as read pulses in some embodiments. In some embodiments the duration is 10-50 ns. In some embodiments, the duration is 1-100 ns. In some embodiments, the duration is 1 ns to 1 microsecond. Writing to the memory cell may take the same time as reading the memory cell in some embodiments.

In one example, the polarity of the read or write pulses may be either a first polarity or a second polarity. For example, a write pulse may apply a voltage to a memory cell in a first polarity (e.g., bitline at +6V and wordline −2.5V).

In one example, after being accessed (e.g., selected), a memory cell may be sensed by a sense component (e.g., sensing circuitry 122) to determine the stored state of the memory cell. For example, a voltage may be applied to the memory cell (using a wordline and bitline) and the presence of a resulting current may depend on the applied voltage and the threshold voltage of the memory cell. In some cases, more than one voltage may be applied. Additionally, if an applied voltage does not result in current flow, other voltages may be applied until a current is detected by the sense component.

By assessing the voltage that resulted in current flow, the stored logic state of the memory cell may be determined. In some cases, the voltage may be ramped up in magnitude until a current flow is detected (e.g., a memory cell turns on, switches on, conducts current, or becomes activated). In other cases, predetermined voltages may be applied sequentially until a current is detected. Likewise, a current may be applied to a memory cell, and the magnitude of the voltage to create the current may depend on the electrical resistance or the threshold voltage of the memory cell.

In some cases, the memory cell (e.g., a PCM cell) includes a material that changes its crystallographic configuration (e.g., between a crystalline phase and an amorphous phase), which in turn, determines a threshold voltage of the memory cell to store information. In other cases, the memory cell includes a material that remains in a crystallographic configuration (e.g., an amorphous phase) that may exhibit variable threshold voltages to store information.

The sense component may include various transistors or amplifiers in order to detect and amplify a difference in the signals. The detected logic state of the memory cell may then be output through a column decoder as output. In some cases, the sense component may be part of a column decoder or a row decoder.

Figure 2:
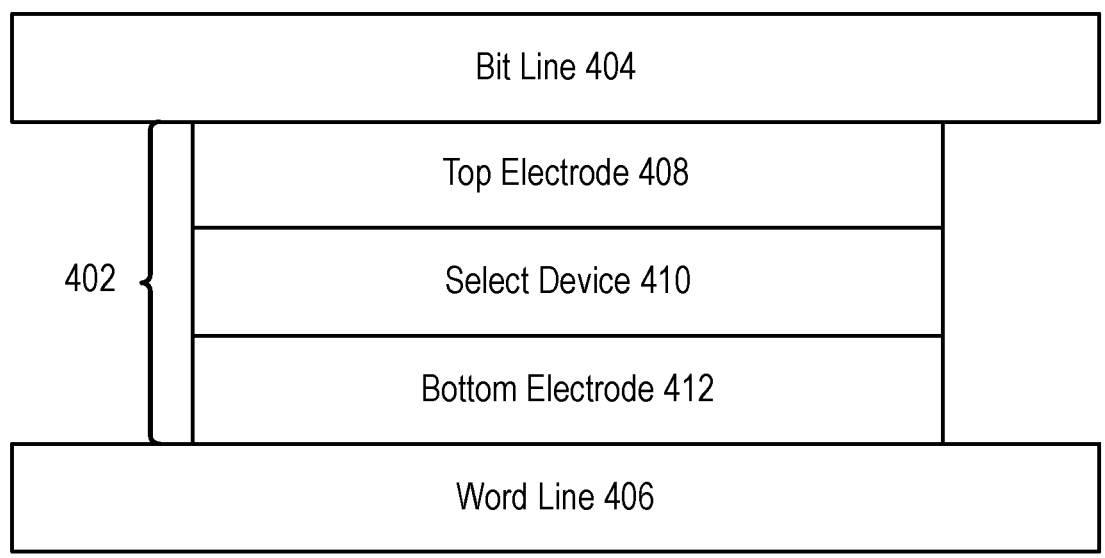
FIG. 2 shows an example of a memory cell that includes a select device, in accordance with some embodiments.

FIG. 2 shows an example of a memory cell 402 that includes a select device, in accordance with some embodiments. In one example, select device 410 includes a chalcogenide. Memory cell 402 is an example of memory cells 110, 112.

Top electrode 408 conductively connects select device 410 to bitline 404, and bottom electrode 412 conductively connects select device 410 to wordline 406. In one example, electrodes 408, 412 are formed of a carbon material.

In one example, select device 410 includes a chalcogenide (e.g., chalcogenide material and/or chalcogenide alloy). Threshold voltage properties of the select device may be based on the voltage polarities applied to the memory cell.

In one example, a logic state may be written to memory cell 402, which may correspond to one or more bits of data. A logic state may be read from or written to the memory cell by applying voltages of different polarities at different voltage and/or current magnitudes. The reading and writing protocols may take advantage of different threshold voltages of the select device that result from the different polarities.

Figure 3:
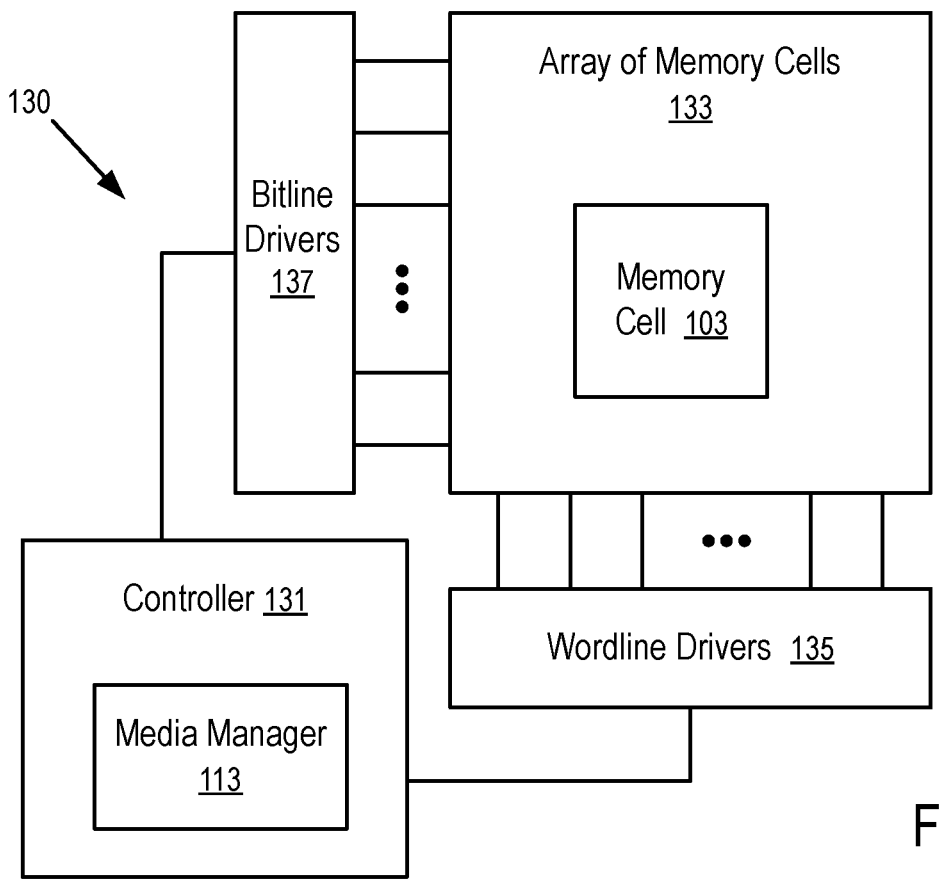
FIG. 3 shows a memory device configured with a media manager according to one embodiment.

FIG. 3 shows a memory device configured with a media manager 113 according to one embodiment. Memory device 130 is an example of memory device 101. In FIG. 3, the memory device 130 includes an array 133 of memory cells, such as a memory cell 103. In one example, an array 133 can be referred to as a tile (or multiple tiles); and a memory device (e.g., 130) can have one or more tiles. Different tiles can be operated in parallel in a memory device (e.g., 130).

For example, the memory device 130 illustrated in FIG. 3 can have a cross-point memory having at least the array 133 of memory cells (e.g., 103). In another example, the memory device 130 illustrated in FIG. 3 can have a 3D vertical architecture having at least the array 133 of memory cells (e.g., 103).

In some implementations, the cross point memory uses a memory cell 103 that has an element (e.g., a sole element) acting both as a selector device and a memory device. For example, the memory cell 103 can use a single piece of alloy with variable threshold capability. The read/write operations of such a memory cell 103 can be based on thresholding the memory cell 103 while inhibiting other cells in sub-threshold bias, in a way similar to the read/write operations for a memory cell having a first element acting as a selector device and a second element acting as a phase-change memory device that are stacked together as a column. A selector device usable to store information can be referred to as a selector/memory device.

The memory device 130 of FIG. 3 includes a controller 131 that operates bitline drivers 137 and wordline drivers 135 to access the individual memory cells (e.g., 103) in the array 133.

Figure 4:
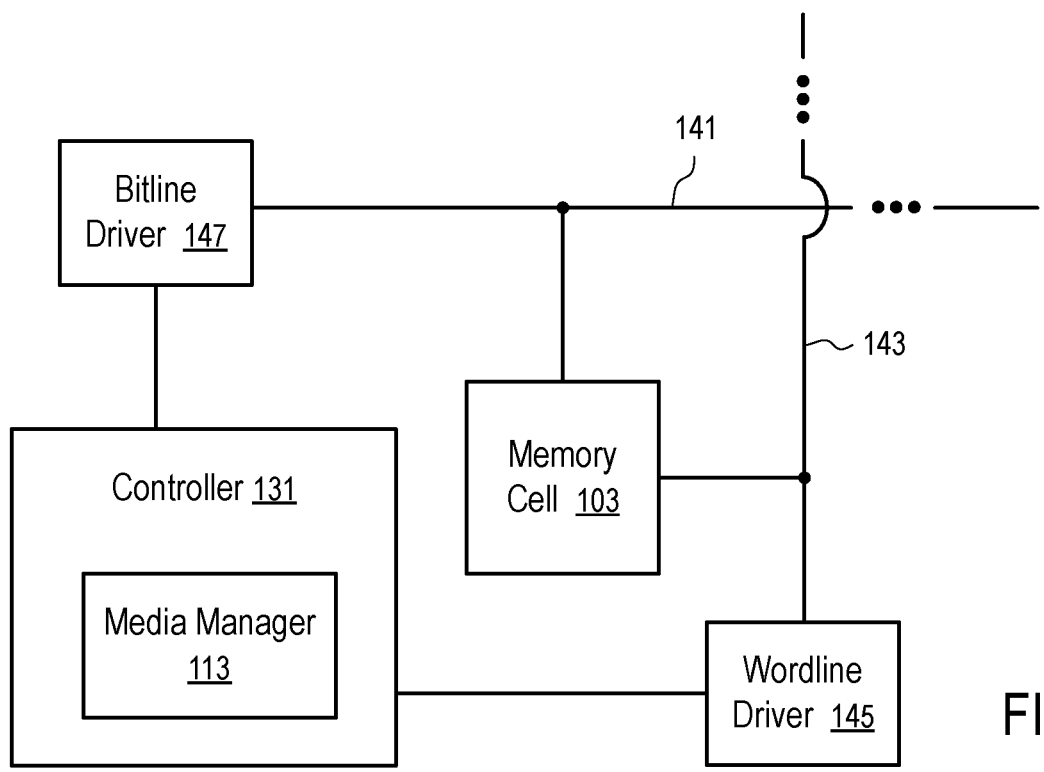
FIG. 4 shows a memory cell with a bitline driver and a wordline driver configured to apply voltage pulses according to one embodiment.

For example, each memory cell (e.g., 103) in the array 133 can be accessed via voltages driven by a pair of a bitline driver 147 and a wordline driver 145, as illustrated in FIG. 4.

The controller 131 includes a media manager 113 configured to implement a process that detects write errors as described herein, and performs various actions based on write error counts. The media manager 113 can be implemented, for example, via logic circuits and/or microcodes/instructions. In one example, the media manager 113 reads counters 104 to determine actions to take.

FIG. 4 shows a memory cell 103 with a bitline driver 147 and a wordline driver 145 configured to apply voltage pulses according to one embodiment. For example, the memory cell 103 can be a typical memory cell 103 in the memory cell array 133 of FIG. 3.

The bitline driver 147 and the wordline driver 145 of FIG. 4 are controlled by controller 131 to selectively apply one or more voltage pulses to the memory cell 103 (e.g., during a write operation). The bitline driver 147 and the wordline driver 145 can apply voltages of different polarities on the memory cell 103.

For example, in applying one polarity of voltage (e.g., positive polarity), the bitline driver 147 drives a positive voltage relative to the ground on a bitline 141 connected to a row of memory cells in the array 133; and the wordline driver 145 drives a negative voltage relative to the ground on a wordline 143 connected to a column of memory cells in the array 133.

In applying the opposite polarity of voltage (e.g., negative polarity), the bitline driver 147 drives a negative voltage on the bitline 141; and the wordline driver 145 drives a positive voltage on the wordline 143.

The memory cell 103 is in both the row connected to the bitline 141 and the column connected to the wordline 143. Thus, the memory cell 103 is subjected to the voltage difference between the voltage driven by the bitline driver 147 on the bitline 141 and the voltage driven by the wordline driver 145 on the wordline 143.

In general, when the voltage driven by the bitline driver 147 is higher than the voltage driven by the wordline driver 145, the memory cell 103 is subjected to a voltage in one polarity (e.g., positive polarity); and when the voltage driven by the bitline driver 147 is lower than the voltage driven by the wordline driver 145, the memory cell 103 is subjected to a voltage in the opposite polarity (e.g., negative polarity).

In some implementations, the memory cell 103 is a self-selecting memory cell implemented using a selector/memory device. The selector/memory device has a chalcogenide (e.g., chalcogenide material and/or chalcogenide alloy). For example, the chalcogenide material can include a chalcogenide glass such as, for example, an alloy of selenium (Se), tellurium (Te), arsenic (As), antimony (Sb), carbon (C), germanium (Ge), and silicon (Si). A chalcogenide material can primarily have selenium (Se), arsenic (As), and germanium (Ge) and be referred to as SAG-alloy. SAG-alloy can include silicon (Si) and be referred to as SiSAG-alloy. In some embodiments, the chalcogenide glass can include additional elements such as hydrogen (H), oxygen (O), nitrogen (N), chlorine (Cl), or fluorine (F), each in atomic or molecular forms.

The selector/memory device has a top side and a bottom side. A top electrode is formed on the top side of the selector/memory device for connecting to a bitline 141; and a bottom electrode is formed on the bottom side of the selector/memory device for connecting to a wordline 143. For example, the top and bottom electrodes can be formed of a carbon material. For example, a chalcogenide material of the memory cell 103 can take the form of a crystalline atomic configuration or an amorphous atomic configuration. The threshold voltage of the memory cell 103 can be dependent on the ratio of the material in the crystalline configuration and the material of the amorphous configuration in the memory cell 103. The ratio can change under various conditions (e.g., having currents of different magnitudes and directions going through the memory cell 103).

A self-selecting memory cell 103, having a selector/memory device, can be programmed to have a threshold voltage window. The threshold voltage window can be created by applying programming pulses with opposite polarity to the selector/memory device. For example, the memory cell 103 can be biased to have a positive voltage difference between two sides of the selector/memory device and alternatively, or to have a negative voltage difference between the same two sides of the selector/memory device. When the positive voltage difference is considered in positive polarity, the negative voltage difference is considered in negative polarity that is opposite to the positive polarity. Reading can be performed with a given/fixed polarity. When programmed, the memory cell has a low threshold (e.g., lower than the cell that has been reset, or a cell that has been programmed to have a high threshold), such that during a read operation, the read voltage can cause a programmed cell to snap and thus become conductive while a reset cell remains non-conductive.

For example, to program the voltage threshold of the memory cell 103, the bitline driver 147 and the wordline driver 145 can drive a pulse of voltage onto the memory cell 103 in one polarity (e.g., positive polarity) to snap the memory cell 103 such that the memory cell 103 is in a conductive state. While the memory cell 103 is conductive, the bitline driver 147 and the wordline driver 145 continue driving the programming pulse to change the threshold voltage of the memory cell 103 towards a voltage region that represents the data or bit value(s) to be stored in the memory cell 103.

The array of memory cells 133 can be configured in an integrated circuit having a plurality of decks of memory cells. Each deck can be sandwiched between a layer of bitlines, a layer of wordlines; and the memory cells in the deck can be arranged in an array 133. A deck can have one or more arrays or tiles. Adjacent decks of memory cells may share a layer of bitlines (e.g., 141) or a layer of wordlines (e.g., 143). Bitlines are arranged to run in parallel in their layer in one direction; and the wordlines are arranged to run in parallel in their layer in another direction orthogonal to the direction of the bitlines. Each of the bitlines is connected to a row of memory cells in the array; and each of the wordlines is connected to a column of memory cells in the array. Bitline drivers 137 are connected to bitlines in the decks; and wordline drivers 135 are connected to wordlines in the decks. Thus, a typical memory cell 103 is connected to a bitline driver 147 and a wordline driver 145.

In some embodiments, the threshold voltage of a typical memory cell 103 is configured to be sufficiently high such that when only one of its bitline driver 147 and wordline driver 145 drives a voltage in either polarity while the other voltage driver holds the respective line to the ground, the magnitude of the voltage applied across the memory cell 103 is insufficient to cause the memory cell 103 to become conductive. Thus, addressing the memory cell 103 can be performed via both of its bitline driver 147 and wordline driver 145 driving a voltage in opposite polarity relative to the ground for operating/selecting the memory cell 103. Other memory cells connected to the same wordline driver 145 can be de-selected by their respective bitline drivers holding the respective bitlines to the ground; and other memory cells connected to the same bitline driver can be de-selected by their respective wordline drives holding the respective wordlines to the ground.

A group of memory cells (e.g., 103) connected to a common wordline driver 145 can be selected for parallel operation by their respective bitline drivers (e.g., 147) driving up the magnitude of voltages in one polarity while the wordline driver 145 is also driving up the magnitude of a voltage in the opposite polarity. Similarly, a group of memory cells connected to a common bitline driver 147 can be selected for parallel operation by their respective wordline drivers (e.g., 145) driving voltages in one polarity while the bitline driver 147 is also driving a voltage in the opposite polarity.

At least some examples are disclosed herein in reference to a cross-point memory having self-selecting memory cells. Other types of memory cells and/or memory can also be used. For example, memory cells each having a selector device and a phase-change memory device can also be used in at least some embodiments. Additionally or alternatively, the memory can have a different architecture, such as a 3D vertical architecture.

Figure 5:
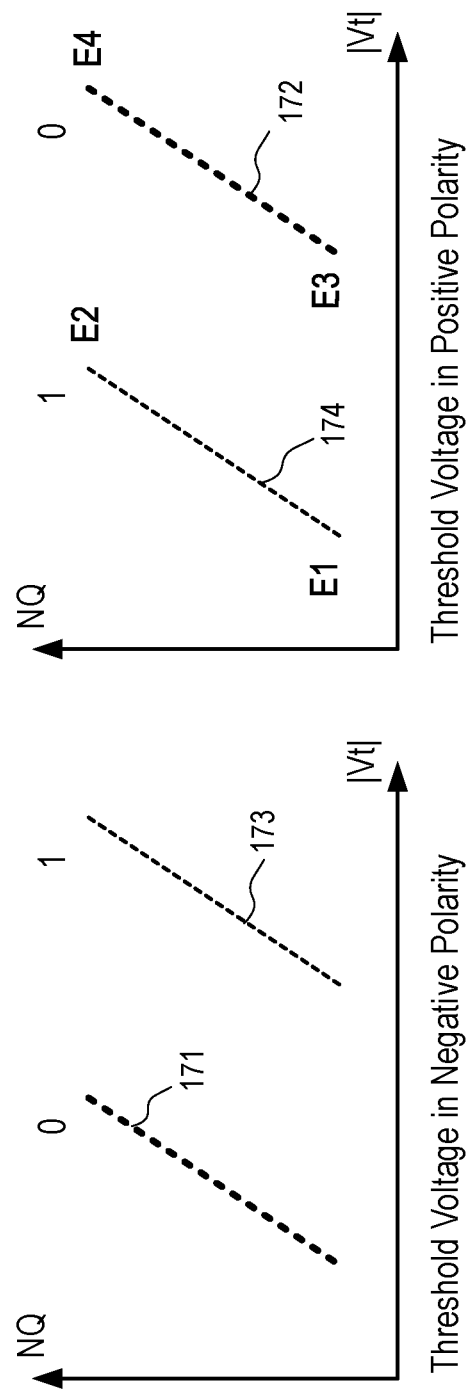
FIG. 5 shows an exemplary normal quantile (NQ) plot representing the statistical distributions of threshold voltages of memory cells.

FIG. 5 shows an exemplary normal quantile (NQ) plot representing the statistical distributions (e.g., 171-174) of threshold voltages of memory cells. In one example, the memory cells are memory cells 110, 112, or 103. When a probability distribution (e.g., 171) of threshold voltages programmed in a region is a normal distribution (also known as Gaussian distribution), its normal quantile (NQ) plot is seen as aligned on a straight line (e.g., distribution 171).

A self-selecting memory cell (e.g., 103) can have a threshold voltage in negative polarity and a threshold voltage in positive polarity. When a voltage applied on the memory cell 103 in either polarity is increased in magnitude up to its threshold voltage in the corresponding polarity, the memory cell (e.g., 103) snaps from a non-conductive state to a conductive state.

The threshold voltage of a memory cell 103 in negative polarity and the threshold voltage of the memory cell 103 in positive polarity can have different magnitudes. Memory cells programmed to have large magnitudes in threshold voltages in positive polarity can have small magnitudes in threshold voltages in negative polarity; and memory cells programmed to have small magnitudes in threshold voltages in positive polarity can have large magnitudes in threshold voltages in negative polarity.

For example, a memory cell can be programmed to have a small magnitude in threshold voltage according to distribution 174 in the positive polarity to represent a value (e.g., one); and as a result, its threshold voltage has a large magnitude according to distribution 173 in the negative polarity to represent the same value (e.g., one).

Alternatively, the memory cell can be programmed to have a large magnitude in threshold voltage according to distribution 172 in the positive polarity to represent another value (e.g., zero); and as a result, its threshold voltage has a smaller magnitude according to distribution 171 in the negative polarity to represent the same value (e.g., zero).

Thus, to determine whether a memory cell 103 is storing the one value (e.g., one) or the other value (e.g., zero), a controller can read the memory cell 103 in either the positive polarity or the negative polarity. If the threshold voltage of the memory cell 103 has a large magnitude according to distribution 172 in the positive polarity, it stores the other value (e.g., zero); otherwise, it stores the one value (e.g., one). Similarly, if the threshold voltage of the memory cell 103 has a large magnitude according to distribution 173 in the negative polarity, it stores the one value (e.g., one); otherwise, it stores the other value (e.g., zero).

For purposes of illustration, the so-called E1, E2, E3, and E4 edges of the distributions 172, 174 are indicated in FIG. 5. For example, the E4 edge of distribution 172 corresponds to the E4 edge of the reset distribution, as mentioned above regarding successful write operations.

The threshold voltage distributions of memory cells may change after a read. For example, in the positive polarity, a read can cause the high magnitude distribution 172 to shift downward, and/or the low magnitude distribution 174 to shift downward.

Similarly, in negative polarity, the read can cause the high magnitude distribution 173 to shift downward, and/or the low magnitude distribution 171 to shift downward.

Figure 6:
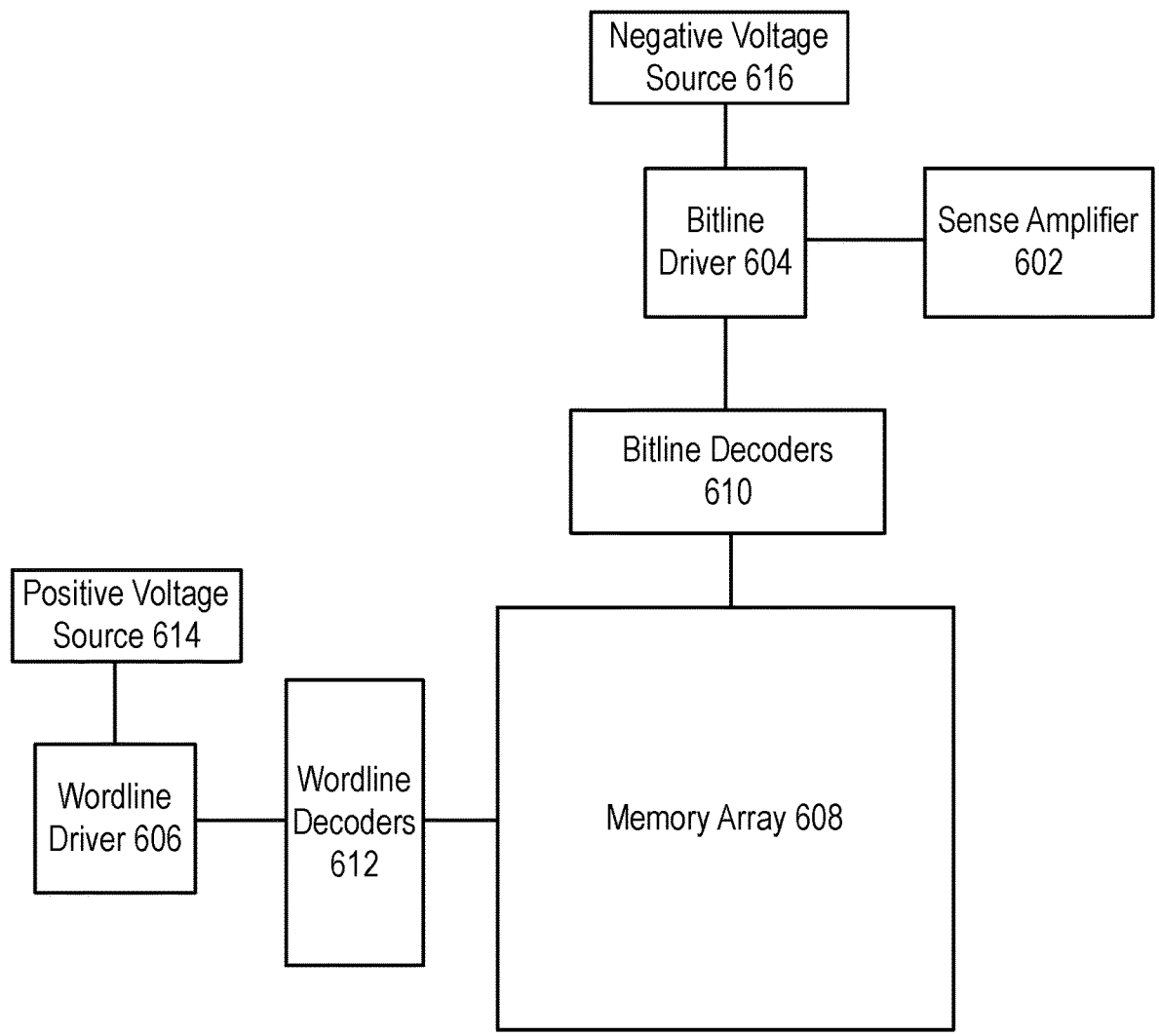
FIG. 6 shows a memory system having a sense amplifier used to determine whether a selected memory cell in a memory array has snapped or reached a threshold state, in accordance with some embodiments.

FIG. 6 shows a memory system having a sense amplifier 602 used to determine whether a selected memory cell in a memory array 608 has snapped or reached a threshold state, in accordance with some embodiments. Memory array 608 is an example of memory array 102, 133. In one example, sense amplifier 602 is implemented in sensing circuitry 122.

Wordline decoders 612 and bitline decoders 610 are used to select a memory cell in memory array 608. Wordline driver 606 and bitline driver 604 are used to apply one or more pulses to the selected memory cell. For example, the pulses can be part of a write operation used to program the selected memory cell. In one example, pulses used for programming the cell can have a magnitude ranging up to 8.5 volts. In contrast, read pulses typically have a lower magnitude ranging up to 5 V. Wordline driver 606 is coupled to a positive voltage source 614, and bitline driver 604 is coupled to a negative voltage source 616.

During a write operation, sense amplifier 602 determines whether the selected memory cell has snapped by detecting a current or voltage associated with the memory cell. In one example, sense amplifier 602 compares a detected cell current with a reference current using a comparator (e.g., a level shifter). Since amplifier 602 can determine whether the cell has snapped after applying, for example, a first pulse, or after applying any one of a subsequent number of pulses.

Figure 7:
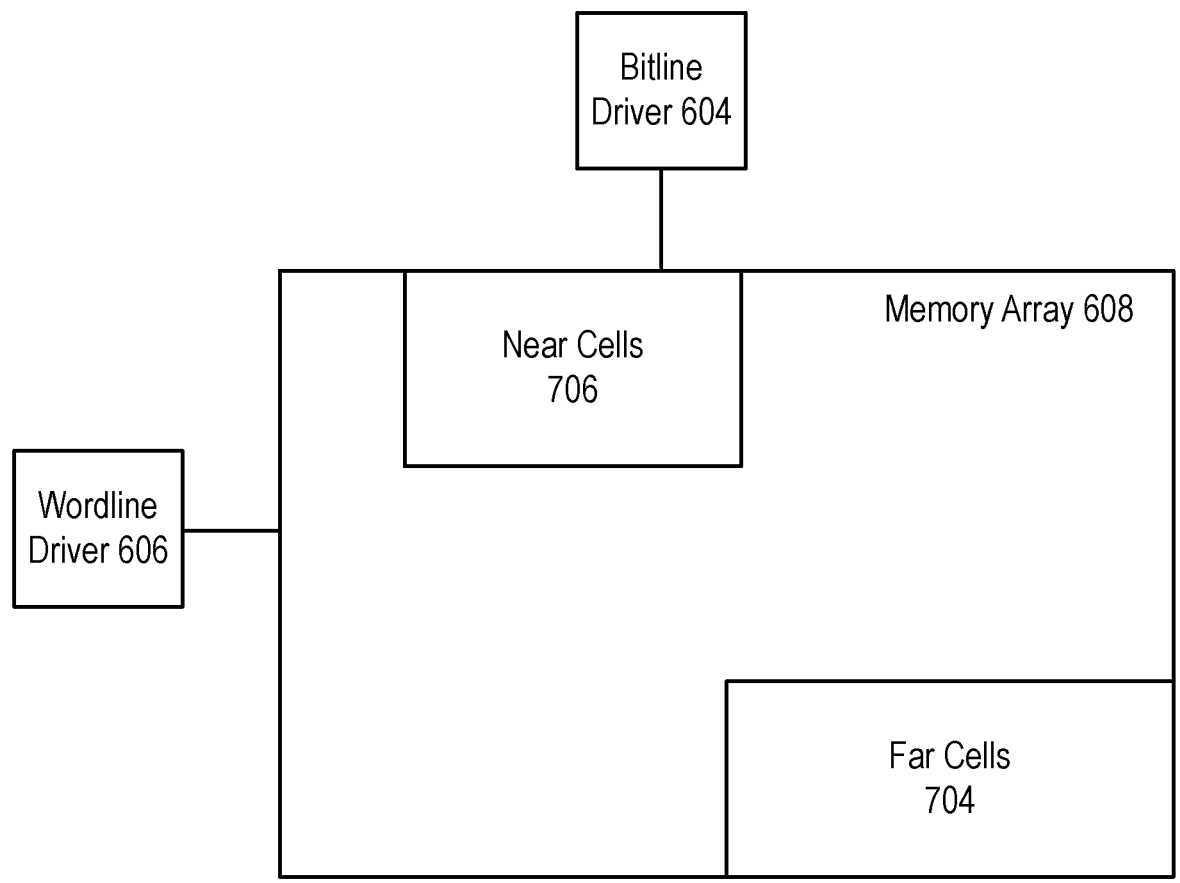
FIG. 7 shows a memory array having near memory cells and far memory cells, in accordance with some embodiments.

FIG. 7 shows a memory array having near memory cells 706 and far memory cells 704, in accordance with some embodiments. Near memory cells 706 are an example of memory cells 110, and far memory cells 704 are an example of memory cells 112.

In one embodiment, near memory cells 706 have an electrical distance from bitline driver 604 that is less than an electrical distance of far cells 704 from bitline driver 604. In one embodiment, near memory cells 706 have an electrical distance from wordline driver 604 that is less than an electrical distance of far cells 704 from wordline driver 604.

A controller (not shown) of a memory device can be configured to enable write error detection as described above for far cells 704, but not for near cells 706. More generally, the controller can determine whether to enable write error detection based on an electrical distance of a memory cell from either or both of bitline and wordline drivers 604, 606.

In one embodiment, the controller determines the electrical distance of memory cells based on an address of each memory cell or a group of cells. In one embodiment, the controller determines whether to enable write error detection based on whether an electrical distance of a memory cell exceeds a threshold (e.g., a threshold distance from a driver).

Figure 8:
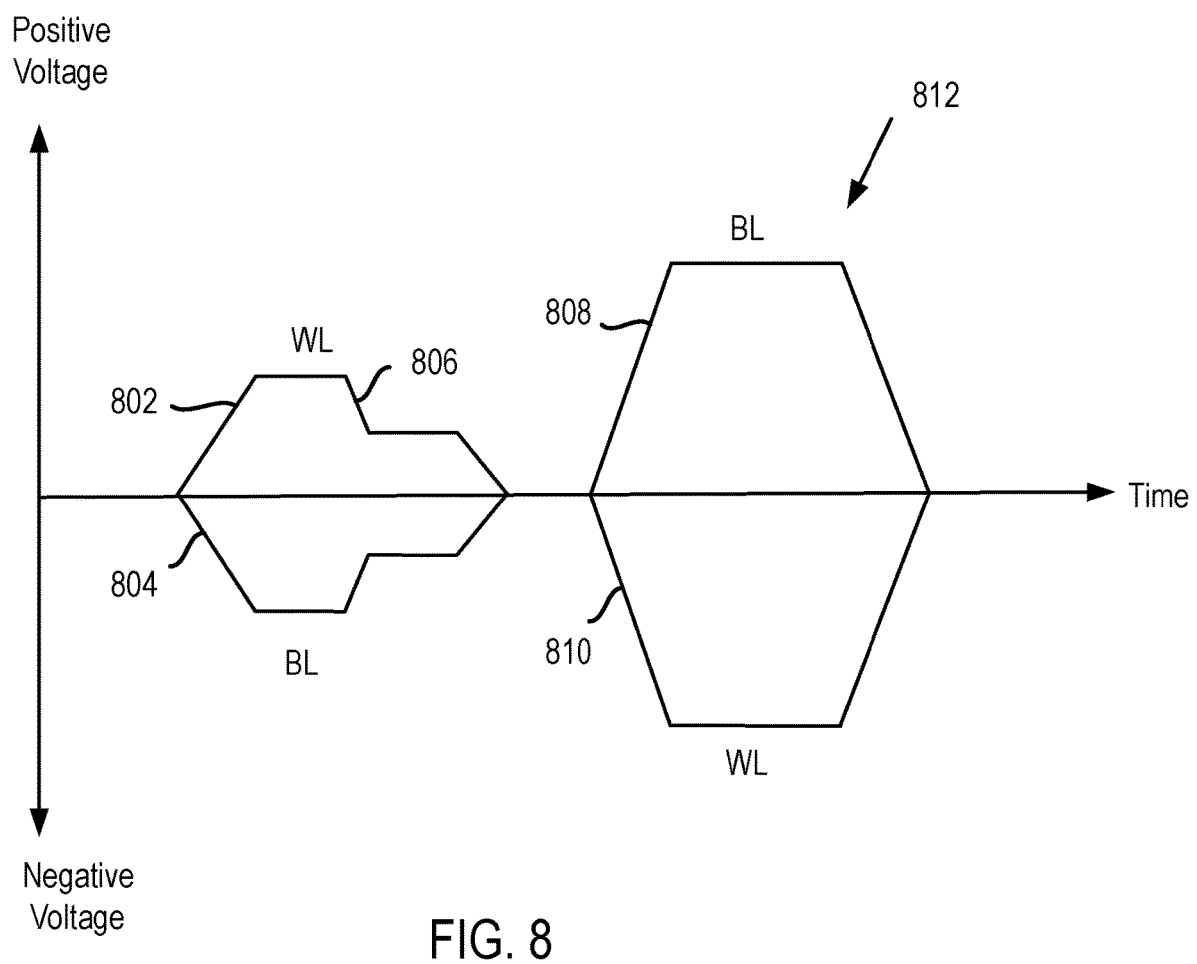
FIG. 8 shows an exemplary graph of voltage vs. time for voltages applied to memory cells during a write operation for a bipolar memory device, in accordance with some embodiments.

FIG. 8 shows an exemplary graph of voltage vs. time for voltages applied to memory cells during a write operation for a bipolar memory device, in accordance with some embodiments. In one example, the voltages are applied to memory cells 110, 112, 103.

A positive voltage waveform 802 is applied to a wordline of a memory cell, and a negative voltage waveform 804 is applied to a bitline of the memory cell. This provides an electrical pulse of a first polarity (e.g., positive polarity). A representative snapping of the memory cell is indicated by abrupt voltage change 806. In one example, sense amplifier 602 is used to determine whether the memory cell has snapped. In one example, waveforms 802, 804 are used to apply a pulse for drift cancellation.

Subsequently, a positive voltage waveform 808 is applied to the bitline of the memory cell, and a negative voltage waveform 810 is applied to the wordline of the memory cell. This provides an electrical pulse of a second opposite polarity (e.g., negative polarity). Waveform 808 has a greater voltage magnitude than waveform 802. Waveform 810 has a greater voltage magnitude than waveform 804.

Prior memory devices fail to detect whether the memory cell snaps in region 812 of the waveform 808. Thus, prior memory devices are not able to detect write errors during write operation. However, various embodiments described herein perform write error detection by determining whether the memory cell snaps in region 812. In one example, sensing circuitry 122 determines whether the memory cell snaps. In one example, sense amplifier 602 determines whether the memory cell snaps.

Figure 9:
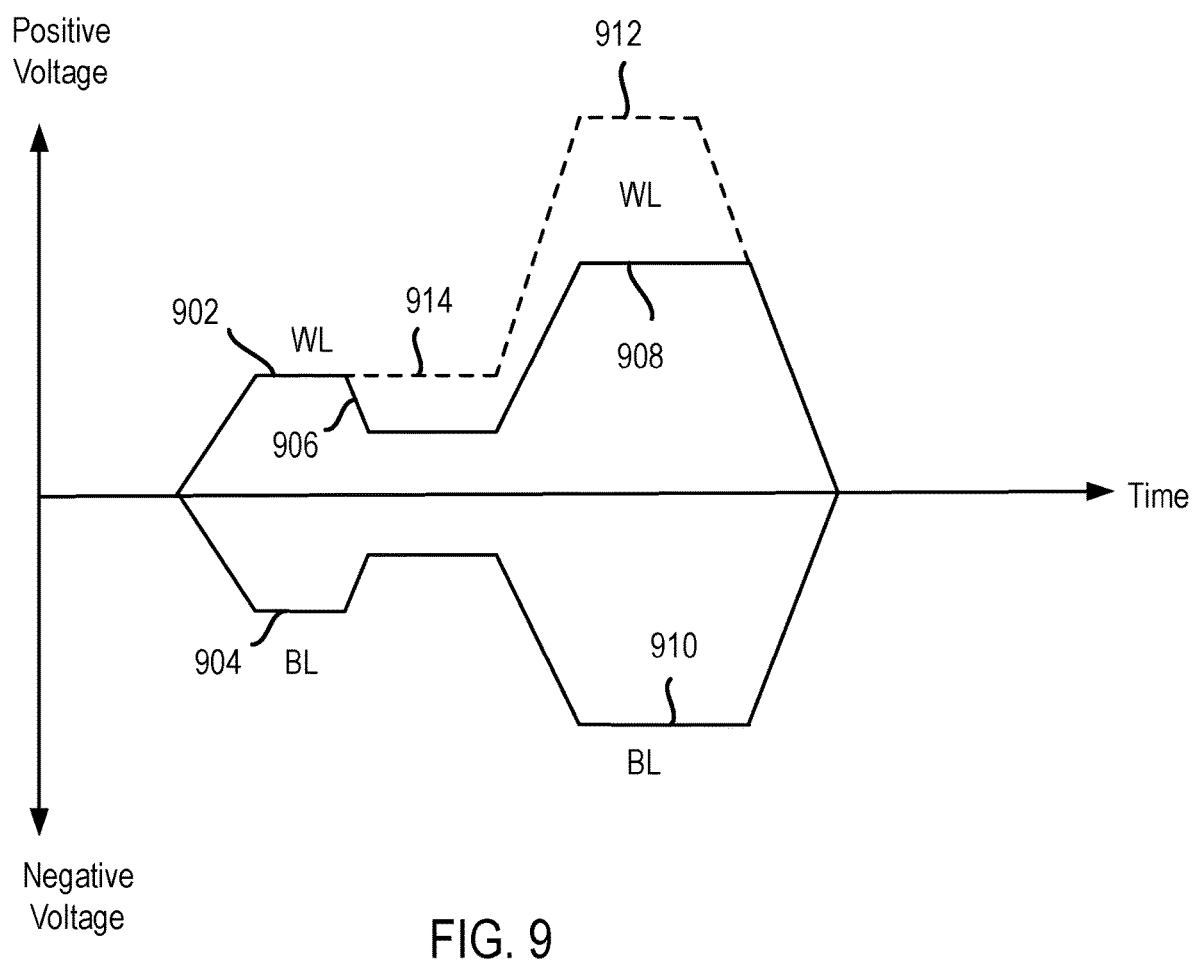
FIG. 9 shows an exemplary graph of voltage vs. time for voltages applied to memory cells during a write operation for a unipolar memory device, in accordance with some embodiments.

FIG. 9 shows an exemplary graph of voltage vs. time for voltages applied to memory cells during a write operation for a unipolar memory device, in accordance with some embodiments. In one example, the memory device is a three-dimensional cross-point memory device.

A waveform is applied to a wordline of a memory cell, as illustrated. The waveform has a voltage magnitude 902 in a first pulse and a voltage magnitude 908 or 912 in a second pulse. A sense amplifier is used to determine whether the memory cell snaps 906 or does not snap 914. If the memory cell snaps, then voltage magnitude 908 is applied in the second pulse. If the memory cell does not snap, then voltage magnitude 912 is applied in the second pulse.

A waveform is applied to a bitline of the memory cell, as illustrated. This waveform has a voltage magnitude 904 in a first pulse and a voltage magnitude 910 in a second pulse.

Figure 10:
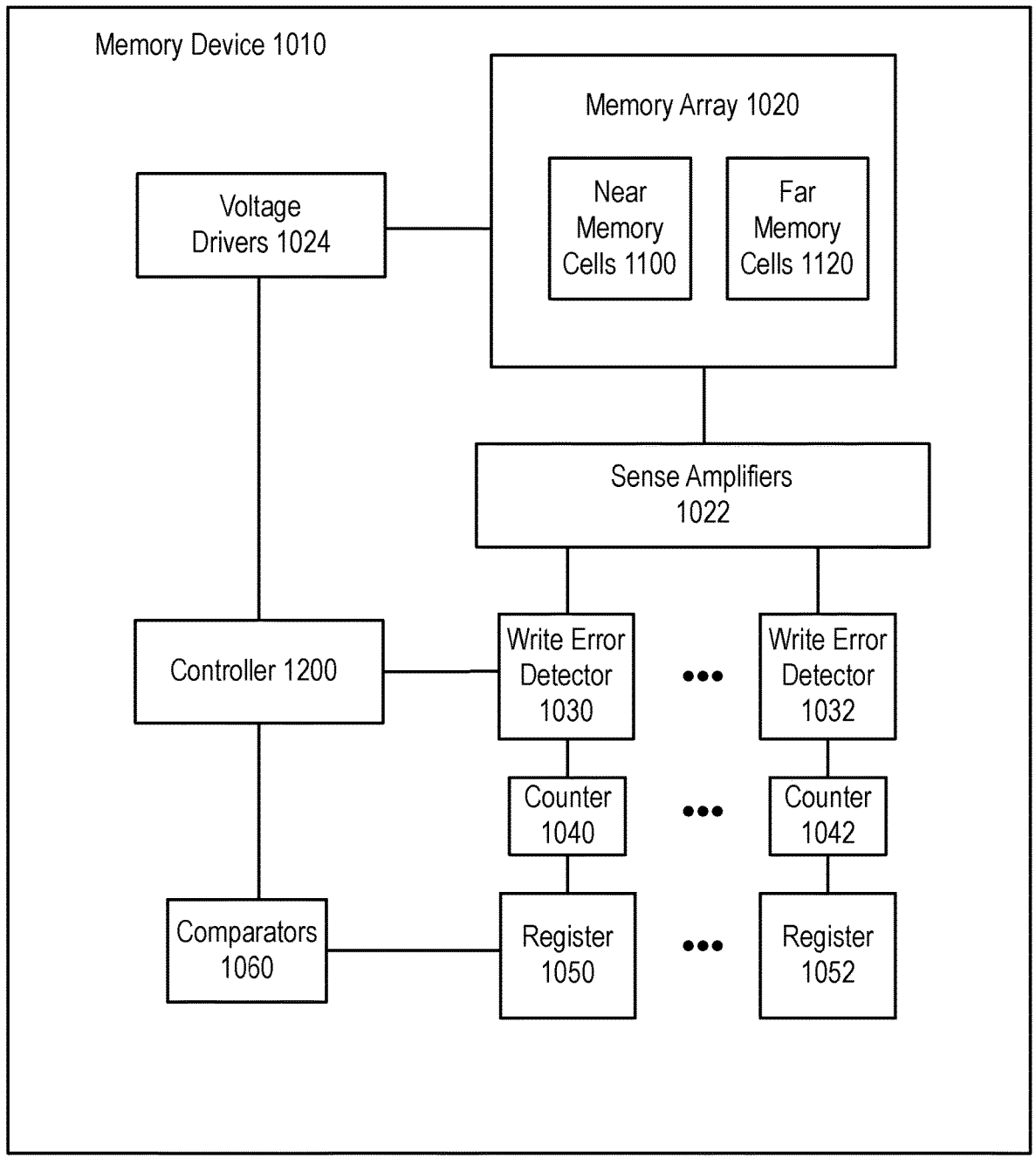
FIG. 10 shows a memory device having counters to count errors that occur during write operations as determined by write error detectors, in accordance with some embodiments.

FIG. 10 shows a memory device 1010 having counters 1040-1042 to count errors that occur during write operations as determined by write error detectors 1030-1032, in accordance with some embodiments. Memory device 1010 is an example of memory device 101. Write error detectors 1030-1032 are an example of write error detectors 130.

Controller 1200 controls voltage drivers 1024 to apply voltage pulses to memory cells in memory array 1020. Bitline driver 604 and wordline driver 606 are examples of voltage drivers 1024.

Sense amplifiers 1022 are used to determine whether memory cells in memory array 1020 snap during a write operation, as discussed above. In one embodiment, each selected memory cell (e.g., one cell per tile) is coupled to a respective one of sense amplifiers 1022 for write error detection (e.g., one sense amplifier 1022 per tile).

In one embodiment, controller 1200 enables write error detection for far memory cells 1120 (but not near memory cells 1100) based on electrical distance, as discussed above. As each write error detector 1030-1032 detects a write error, corresponding counters 1040-1042 are incremented. The error count in counters 1040-1042 is stored in registers 1050-1052, which can be read by controller 1200. In one embodiment, comparators 1060 compare an error count stored in registers 1050-1052 against respective corresponding thresholds. If the threshold is exceeded, then controller 1200 performs one or more actions, such as discussed above.

Figure 11:
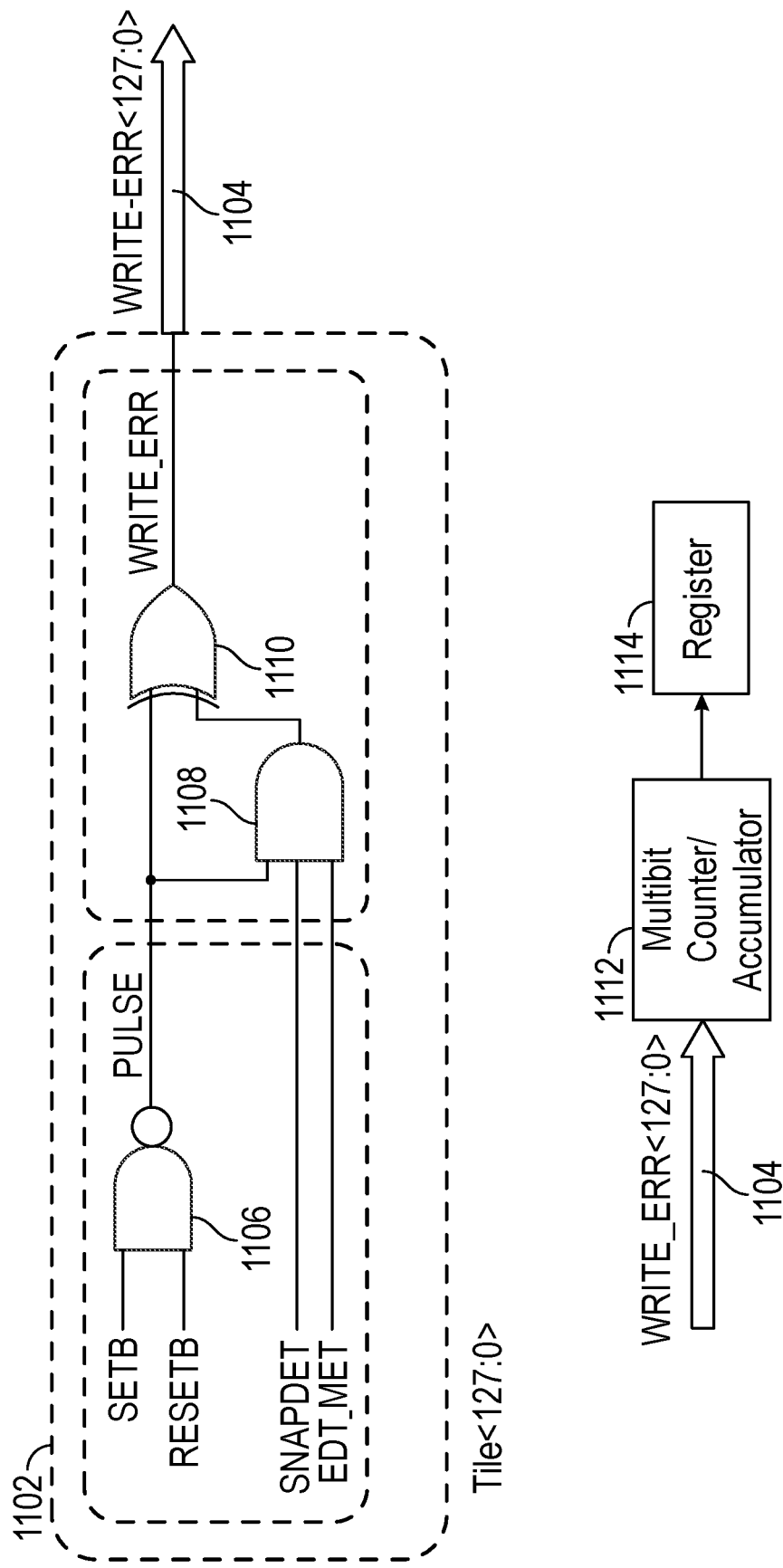
FIG. 11 shows logic circuitry for detecting write errors and a counter for counting detected errors, in accordance with some embodiments.

FIG. 11 shows logic circuitry 1102 for detecting write errors and a counter 1112 for counting detected errors, in accordance with some embodiments. Logic circuitry 1102 generates write error signals 1104, which cause counter 1112 to increment a count of write errors. The count of write errors is stored in register 1114.

In one example, logic circuitry 1102 is configured in write error detectors 1030-1032. Counter 1112 is an example of counters 1040-1042. Register 1114 is an example of registers 1050-1052.

In one embodiment, counter 1112 is a multi-bit counter that encodes write error signals 1104 to provide an encoded write error count that is stored in register 1114. In one embodiment, counter 1112 accumulates the count of write errors over multiple write operations. For example, all failing memory cells (e.g., the number of failing bits in a total of 128 bits) are counted and accumulated. A controller (not shown) reads the count of write errors from register 1114 after a defined number of write operations have been performed (e.g., after each 100 to 10,000 write operations).

In one example, a respective instance of logic circuitry 1102 is used for each of 128 tiles (e.g., tile 127:0). Each respective logic circuitry 1102 generates a write error signal for a selected memory cell in the respective tile. In one example, 128 write error signals 1104 are generated simultaneously (e.g., during a common write operation).

Each write error signal 1104 is an output from exclusive OR gate 1110. Outputs from logical NAND gate 1106 and logical AND gate 1108 provide inputs to exclusive OR gate 1110.

Logical NAND gate 1106 has inputs SETB and RESETB provided from a controller. These inputs correspond to a write operation that programs memory cell to either a set or a reset state.

Logical AND gate 1108 has inputs SNAPDET and EDT_MET. Input SNAPDET corresponds to a detection of snapping of a selected memory cell using a sense amplifier, as described above.

Input EDT_MET corresponds to a determination by the controller that a selected memory cell satisfies a condition associated with electrical distance. For example, the selected memory cell has an electrical distance that exceeds a threshold, or the selected memory cell has an address that falls within a defined range. In one example, input EDT_MET is provided by controller 1200. In one example, input SNAPDET is provided by one of sense amplifiers 1022.

In one example, when a tile is to execute a write pulse, SETB or RESETB is asserted LOW, and PULSE is asserted HIGH. EDT_MET is asserted HIGH when the electrical distance of a current address for a selected memory cell is greater than an electrical distance (ED) threshold register value (e.g., factory-defined). This allows for targeting a specific memory array region.

In one example, EDT_MET being asserted high means that the 128 cells concurrently being accessed are located in what is considered a FAR region or FAR ED (e.g., far memory cells 1120). The sense amp is being utilized (or is running) regardless of the voltage to which EDT_MET is driven, but the EDT_MET signal is used to determine whether the result of the sense amplifier regarding snap detection is to be checked for errors.

SNAPDET is asserted HIGH when the selected memory cell is in a threshold state. The sense amplifier for the memory cell is enabled for this snap detection. In one example, near the end of the write pulse, one node of the memory cell can be connected to a sense amplifier (SA) at a lower voltage (to avoid a false detect).

WRITE_ERR is asserted HIGH when the memory cell being written does not threshold. For example, the number of non-thresholding cells during the write is counted and accumulated and moved to register 1114.

Figure 12:
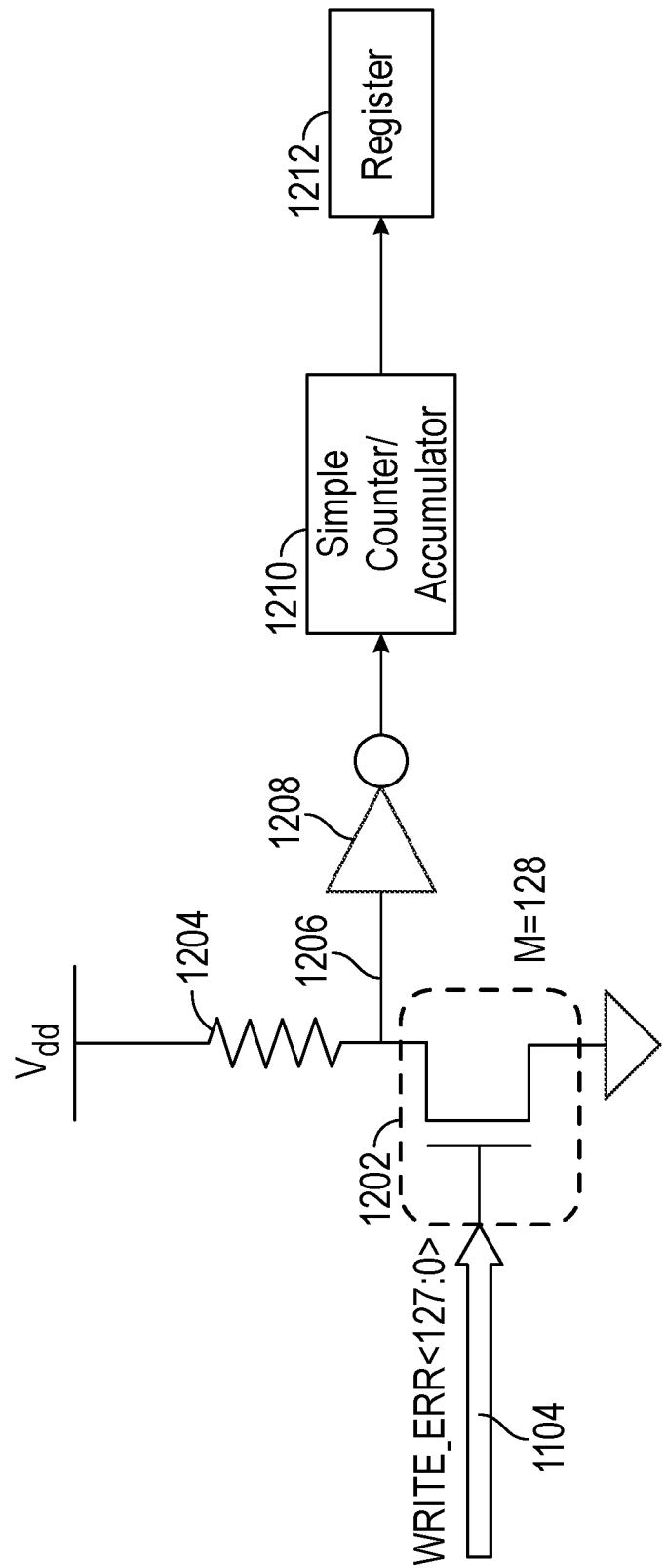
FIG. 12 shows a logic gate used with a counter to count write errors, in accordance with some embodiments.

FIG. 12 shows a logical OR gate 1202 used with a counter 1210 to count write errors, in accordance with some embodiments. Logical OR gate 1202 can be used with logic circuitry 1102. Logical OR gate 1202 has write error signals 1104 as inputs. For example, logical OR gate 1202 has 128 MOSFETs in series between resistor 1204 and ground. Resistor 1204 is also connected to a positive voltage (e.g., Vdd).

The output of logical OR gate 1202 is coupled to counter 1210. The output of logical OR gate 1202 is an input to inverter 1208, which provides an output to counter 1210. Counter 1210 counts the number of write errors detected. The count of write errors is stored in register 1212.

In one example, logical OR gate 1202 is implemented in write detectors 1030-1032. Register 1212 is an example of registers 1050-1052.

In one example, controller 1200 counts only the number of times that a write operation has one or more non-thresholding cells and moves this count into register 1212.

In one embodiment, a controller reads out the write error count value in register 1212 and applies media management based on the write error count value. For example, the media management can include refresh, write retry, wear leveling, block retirement, and/or write cycle binning (increase selection voltage).

In one embodiment, counters 1112, 1210 and registers 1114, 1212 are resettable by the controller.

Figure 13:
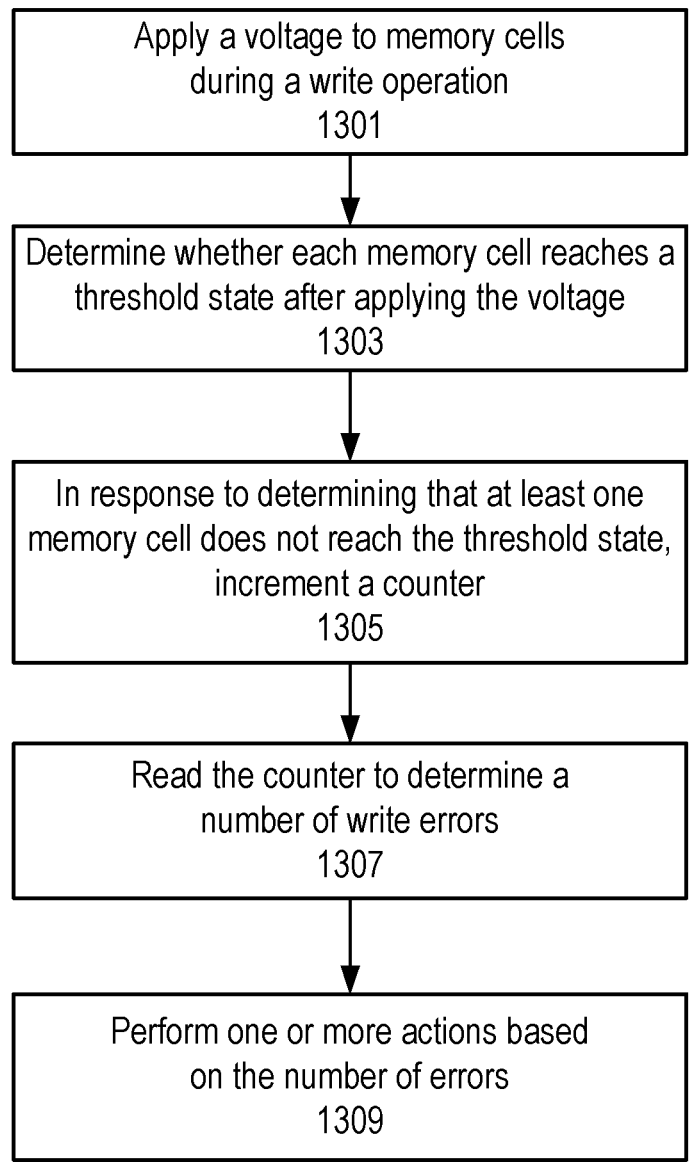
FIG. 13 shows a method for using one or more write error counters for media management in a memory device, in accordance with some embodiments.

FIG. 13 shows a method for using one or more write error counters for media management in a memory device, in accordance with some embodiments. For example, the method of FIG. 13 can be implemented in the system of FIG. 10.

The method of FIG. 13 can be performed by processing logic that can include hardware (e.g., processing device, circuitry, dedicated logic, programmable logic, microcode, hardware of a device, integrated circuit, etc.), software (e.g., instructions run or executed on a processing device), or a combination thereof. In some embodiments, the method of FIG. 13 is performed at least in part by one or more processing devices (e.g., controller 1200 of FIG. 10).

Although shown in a particular sequence or order, unless otherwise specified, the order of the processes can be modified. Thus, the illustrated embodiments should be understood only as examples, and the illustrated processes can be performed in a different order, and some processes can be performed in parallel. Additionally, one or more processes can be omitted in various embodiments. Thus, not all processes are required in every embodiment. Other process flows are possible.

At block 1301, a voltage is applied to memory cells during a write operation. In one example, the voltage is applied to far memory cells 1120.

At block 1303, a determination is made whether each memory cell reaches a threshold state after applying the voltage. In one example, a controller determines whether memory cells snap by using sense amplifiers 1022 and write error detectors 1030-1032.

At block 1305, in response to determining that at least one memory cell does not reach the threshold state, a counter is incremented. In one example, counter 1040 is incremented in response to determining that a selected memory cell does not snap.

At block 1307, the counter is read to determine a number of write errors. In one example, controller 120 reads counter 104. In one example, controller 1200 reads a write error count in register 1050.

At block 1309, one or more actions are performed based on the number of write errors. In one example, the actions are implemented using media manager 113. In one example, controller 1200 changes a voltage magnitude and/or timing for write pulses applied to memory cells during write operations.

In one embodiment, an apparatus comprises: a counter (e.g., 1040); a memory array (e.g., 1020) having a plurality of memory cells; and at least one controller (e.g., 1200) configured to: apply, during a write operation, a first pulse to a memory cell in the memory array; after applying the first pulse, apply a second pulse to the memory cell; determine whether the memory cell snaps due to applying the second pulse; in response to determining that the memory cell does not snap due to applying the second pulse, increment a count of write errors using the counter; determine whether the count has reached a threshold; and in response to determining that the count has reached the threshold, perform an action associated with the memory array.

In one embodiment, the action associated with the memory array is applying a third pulse to the memory cell as part of the write operation, and the third pulse has a greater voltage magnitude than a voltage magnitude of either the first or second pulses.

In one embodiment, the memory cell is a phase change memory cell, and the first pulse is used for drift cancellation.

In one embodiment, the apparatus further comprises a sense amplifier (e.g., 1022), wherein determining whether the memory cell snaps comprises sensing, using the sense amplifier, a current or voltage associated with the memory cell.

In one embodiment, determining whether the memory cell snaps comprises determining whether a current associated with the memory cell exceeds a threshold.

In one embodiment, the controller is further configured to: determine whether the memory cell snaps due to applying the first pulse; and in response to determining that the memory cell does not snap due to applying the first pulse, increase a voltage of the second pulse.

In one embodiment, the first pulse has a first polarity; the second pulse has a second polarity; and the second polarity is opposite to the first polarity.

In one embodiment, a voltage magnitude of the second pulse is greater than a voltage magnitude of the first pulse.

In one embodiment, the controller is further configured to perform write verifications during write operations for the memory cells. In one example, the write verification confirms that a selected memory cell in a tile has snapped.

In one embodiment, the first and second pulses are applied using a wordline and a bitline of the memory array.

In one embodiment, the memory array is a planar two-dimensional array, and the memory cell is located at a crossing of the wordline and bitline.

In one embodiment, the memory array is a vertical three-dimensional array, and the bitline is a vertical pillar crossing a horizontal plane in which the wordline is located.

In one embodiment, the apparatus further comprises logic circuitry (e.g., 1102) to generate write error signals, wherein the write error signals cause the counter to increment the count of write errors.

In one embodiment, the counter is a multi-bit counter (e.g., 1112) that encodes the write error signals to provide an encoded write error count.

In one embodiment, the write error signals are inputs to a logical OR gate (e.g., 1202) that generates an error output, and the error output is an input to the counter.

In one embodiment, the apparatus further comprises a register (e.g., 1050), wherein the count of write errors is stored in the register, and wherein the controller is further configured to read the register to determine whether the count has reached the threshold.

In one embodiment, the counter accumulates the count of write errors over multiple write operations, and the controller is further configured to read the count after a defined number of write operations have been performed.

In one embodiment, the at least one controller comprises a first controller on a first die that includes the memory array, and a second controller on a second die.

In one embodiment, the controller is further configured to determine whether an electrical distance of the memory cell satisfies a condition; and the count of write errors is incremented further in response to determining that the electrical distance satisfies the condition.

In one embodiment, determining whether the electrical distance satisfies the condition comprises determining whether an address of the memory cell is greater than a threshold value or within a defined address range.

In one embodiment, the electrical distance is an electrical distance from a wordline or bitline driver that applies at least one of the first or second pulses.

In one embodiment, the counter is implemented using a full adder.

In one embodiment, an apparatus comprises: a sense amplifier; a counter; memory comprising a plurality of memory cells; access lines (e.g., bitlines and wordlines) to select the memory cells for performing write operations on the memory cells; and control circuitry configured to: apply, during a write operation and using at least one of the access lines, a voltage to a memory cell; determine, using the sense amplifier, whether the memory cell reaches a threshold state after applying the voltage; in response to determining that the memory cell does not reach the threshold state, increment an error count using the counter; read the counter to determine the error count; and based on the determined error count, perform at least one action.

In one embodiment, the action includes at least one of: refreshing the memory cell; retrying the write operation; wear leveling; retirement of a block or other portion of the memory; write cycle binning in which a selection voltage is increased for at least one bin; changing a shape for a waveform of a write voltage applied to the memory cells; or increasing a voltage applied to at least one of a wordline or a bitline used to select the memory cells.

In one embodiment, the apparatus further comprises a register, wherein: the error count is stored in the register; reading the counter comprises reading the register; and the action is performed based on whether the count has reached a threshold.

In one embodiment, determining whether the memory cell reaches the threshold state is only performed if an electrical distance of the memory cell satisfies a condition.

In one embodiment, the condition includes an address of the memory cell being within an address range (e.g., an address range for far memory cells 1120).

In one embodiment, a method comprises: applying, during a write operation, a voltage to a plurality of memory cells; determining whether each of the memory cells reaches a respective threshold state after applying the voltage; in response to determining that at least one of the memory cells does not reach the respective threshold state, incrementing a counter; reading the counter to determine a number of errors; and based on the determined number of errors, performing at least one action.

In one embodiment, the number of errors includes errors that occur over multiple write operations.

In one embodiment, the action includes increasing a voltage applied to at least one of a wordline or bitline used to select memory cells during write operations.

In one embodiment, the plurality of memory cells is accessed using a common address. In one example, the address is decoded into a wordline address and a bitline address and, in turn, used to select a physical wordline and bitline. Within a physical bitline or a physical word line, only one cell is allowed to be selected or snapped.

In one example, a write pulse is applied to a wordline and bitline. A number of bits that do not snap is counted. In one example, 128 memory cells along the wordline are written. The number of cells that do not snap is counted.

In one example, a dimension of a tile in a memory array is 4096 bitlines by 4096 wordlines. For any given write operation, only one cell from this array (of 16 Mbits) is accessed. 128 tiles are concurrently involved in a given operation, but only one bit per tile, and thus 128 cells total at a time is accessed. This collection of 128 tiles is typically referred to as a partition. There can be, for example, as many as 32 partitions in a memory array.

In one example, the addressing and decoding are common for all 128 tiles in a partition, though physically, each tile will have its own wordline (WL) and bitline (BL) accessed. In other words, if WL=0 and BL=12 is accessed in tile 0, it would be the similar WL=0 and BL=12 being accessed on the other 127 tiles. This means that if the bit accessed on tile 0 is a far memory cell (FAR ED bit), there would also be far memory cells (FAR ED bits) being accessed on the other 127 tiles.

In one embodiment, write error detectors are used to perform a write verify without needing to perform a separate, distinct reading step (e.g., the verification is done on-the-fly, during the write itself). A write fail identification (e.g., write error count above a threshold) may be used to trigger an action(s) to prevent subsequent fails. This write verification is not limited to a planar architecture (e.g., with cells at crossing of WLs and BLs on different levels). Instead, the approach also can be used for vertical architectures (e.g., BL pillars crossing WL planes).

The disclosure includes various devices which perform the methods and implement the systems described above, including data processing systems which perform these methods, and computer-readable media containing instructions which when executed on data processing systems cause the systems to perform these methods.

The description and drawings are illustrative and are not to be construed as limiting. Numerous specific details are described to provide a thorough understanding. However, in certain instances, well-known or conventional details are not described in order to avoid obscuring the description. References to one or an embodiment in the present disclosure are not necessarily references to the same embodiment; and, such references mean at least one.

As used herein, "coupled to" or "coupled with" generally refers to a connection between components, which can be an indirect communicative connection or direct communicative connection (e.g., without intervening components), whether wired or wireless, including connections such as electrical, optical, magnetic, etc.

Reference in this specification to "one embodiment" or "an embodiment" means that a particular feature, structure, or characteristic described in connection with the embodiment is included in at least one embodiment of the disclosure. The appearances of the phrase "in one embodiment" in various places in the specification are not necessarily all referring to the same embodiment, nor are separate or alternative embodiments mutually exclusive of other embodiments. Moreover, various features are described which may be exhibited by some embodiments and not by others. Similarly, various requirements are described which may be requirements for some embodiments but not other embodiments.

In this description, various functions and/or operations may be described as being performed by or caused by software code to simplify description. However, those skilled in the art will recognize what is meant by such expressions is that the functions and/or operations result from execution of the code by one or more processing devices, such as a microprocessor, Application-Specific Integrated Circuit (ASIC), graphics processor, and/or a Field-Programmable Gate Array (FPGA). Alternatively, or in combination, the functions and operations can be implemented using special purpose circuitry (e.g., logic circuitry), with or without software instructions. Embodiments can be implemented using hardwired circuitry without software instructions, or in combination with software instructions. Thus, the techniques are not limited to any specific combination of hardware circuitry and software, nor to any particular source for the instructions executed by a computing device.

While some embodiments can be implemented in fully functioning computers and computer systems, various embodiments are capable of being distributed as a computing product in a variety of forms and are capable of being applied regardless of the particular type of computer-readable medium used to actually effect the distribution.

At least some aspects disclosed can be embodied, at least in part, in software. That is, the techniques may be carried out in a computing device or other system in response to its processing device, such as a microprocessor, executing sequences of instructions contained in a memory, such as ROM, volatile RAM, non-volatile memory, cache or a remote storage device.

Routines executed to implement the embodiments may be implemented as part of an operating system, middleware, service delivery platform, SDK (Software Development Kit) component, web services, or other specific application, component, program, object, module or sequence of instructions (sometimes referred to as computer programs). Invocation interfaces to these routines can be exposed to a software development community as an API (Application Programming Interface). The computer programs typically comprise one or more instructions set at various times in various memory and storage devices in a computer, and that, when read and executed by one or more processors in a computer, cause the computer to perform operations necessary to execute elements involving the various aspects.

A computer-readable medium can be used to store software and data which when executed by a computing device causes the device to perform various methods. The executable software and data may be stored in various places including, for example, ROM, volatile RAM, non-volatile memory and/or cache. Portions of this software and/or data may be stored in any one of these storage devices. Further, the data and instructions can be obtained from centralized servers or peer to peer networks. Different portions of the data and instructions can be obtained from different centralized servers and/or peer to peer networks at different times and in different communication sessions or in a same communication session. The data and instructions can be obtained in entirety prior to the execution of the applications. Alternatively, portions of the data and instructions can be obtained dynamically, just in time, when needed for execution. Thus, it is not required that the data and instructions be on a computer-readable medium in entirety at a particular instance of time.

Examples of computer-readable media include, but are not limited to, recordable and non-recordable type media such as volatile and non-volatile memory devices, read only memory (ROM), random access memory (RAM), flash memory devices, solid-state drive storage media, removable disks, magnetic disk storage media, optical storage media (e.g., Compact Disk Read-Only Memory (CD ROMs), Digital Versatile Disks (DVDs), etc.), among others. The computer-readable media may store the instructions. Other examples of computer-readable media include, but are not limited to, non-volatile embedded devices using NOR flash or NAND flash architectures. Media used in these architectures may include un-managed NAND devices and/or managed NAND devices, including, for example, eMMC, SD, CF, UFS, and SSD.

In general, a non-transitory computer-readable medium includes any mechanism that provides (e.g., stores) information in a form accessible by a computing device (e.g., a computer, mobile device, network device, personal digital assistant, manufacturing tool having a controller, any device with a set of one or more processors, etc.). A "computer-readable medium" as used herein may include a single medium or multiple media (e.g., that store one or more sets of instructions).

In various embodiments, hardwired circuitry may be used in combination with software and firmware instructions to implement the techniques. Thus, the techniques are neither limited to any specific combination of hardware circuitry and software nor to any particular source for the instructions executed by a computing device.

Various embodiments set forth herein can be implemented using a wide variety of different types of computing devices. As used herein, examples of a "computing device" include, but are not limited to, a server, a centralized computing platform, a system of multiple computing processors and/or components, a mobile device, a user terminal, a vehicle, a personal communications device, a wearable digital device, an electronic kiosk, a general purpose computer, an electronic document reader, a tablet, a laptop computer, a smartphone, a digital camera, a residential domestic appliance, a television, or a digital music player. Additional examples of computing devices include devices that are part of what is called "the internet of things" (IOT). Such "things" may have occasional interactions with their owners or administrators, who may monitor the things or modify settings on these things. In some cases, such owners or administrators play the role of users with respect to the "thing" devices. In some examples, the primary mobile device (e.g., an Apple iPhone) of a user may be an administrator server with respect to a paired "thing" device that is worn by the user (e.g., an Apple watch).

In some embodiments, the computing device can be a computer or host system, which is implemented, for example, as a desktop computer, laptop computer, network server, mobile device, or other computing device that includes a memory and a processing device. The host system can include or be coupled to a memory sub-system so that the host system can read data from or write data to the memory sub-system. The host system can be coupled to the memory sub-system via a physical host interface. In general, the host system can access multiple memory sub-systems via a same communication connection, multiple separate communication connections, and/or a combination of communication connections.

In some embodiments, the computing device is a system including one or more processing devices. Examples of the processing device can include a microcontroller, a central processing unit (CPU), special purpose logic circuitry (e.g., a field programmable gate array (FPGA), an application specific integrated circuit (ASIC), etc.), a system on a chip (SoC), or another suitable processor.

In one example, a computing device is a controller of a memory system. The controller includes a processing device and memory containing instructions executed by the processing device to control various operations of the memory system.

Although some of the drawings illustrate a number of operations in a particular order, operations which are not order dependent may be reordered and other operations may be combined or broken out. While some reordering or other groupings are specifically mentioned, others will be apparent to those of ordinary skill in the art and so do not present an exhaustive list of alternatives. Moreover, it should be recognized that the stages could be implemented in hardware, firmware, software or any combination thereof.

In the foregoing specification, the disclosure has been described with reference to specific exemplary embodiments thereof. It will be evident that various modifications may be made thereto without departing from the broader spirit and scope as set forth in the following claims. The specification and drawings are, accordingly, to be regarded in an illustrative sense rather than a restrictive sense.

What is claimed is:

1. An apparatus comprising:
a counter;
a memory array having a plurality of memory cells; and
at least one controller configured to:
determine whether a memory cell snaps due to applying at least one pulse to the memory cell;
in response to determining that the memory cell does not snap, increment a count using the counter;
determine whether the count has reached a threshold; and
in response to determining that the count has reached the threshold, perform an action associated with the memory array.

2. The apparatus of claim 1, wherein:
applying the at least one pulse comprises applying, during a write operation, a first pulse to the memory cell, and after applying the first pulse, applying a second pulse to the memory cell; and
the action associated with the memory array is applying a third pulse to the memory cell as part of the write operation, and the third pulse has a greater voltage magnitude than a voltage magnitude of either the first or second pulses.

3. The apparatus of claim 1, further comprising a sense amplifier, wherein determining whether the memory cell snaps comprises sensing, using the sense amplifier, a current or voltage associated with the memory cell.

4. The apparatus of claim 1, wherein determining whether the memory cell snaps comprises determining whether a current associated with the memory cell exceeds a threshold.

5. The apparatus of claim 1, wherein the pulse is a first pulse and the controller is further configured to:
determine whether the memory cell snaps due to applying the first pulse; and
in response to determining that the memory cell does not snap due to applying the first pulse, increase a voltage of a second pulse applied to the memory cell.

6. The apparatus of claim 1, wherein the memory array is a planar two-dimensional array, and the memory cell is located at a crossing of a wordline and a bitline.

7. The apparatus of claim 1, further comprising logic circuitry to generate write error signals, wherein the write error signals cause the counter to increment the count of write errors.

8. The apparatus of claim 7, wherein the counter is a multi-bit counter that encodes the write error signals to provide an encoded write error count.

9. The apparatus of claim 7, wherein the write error signals are inputs to a logical OR gate that generates an error output, and the error output is an input to the counter.

10. The apparatus of claim 1, further comprising a register, wherein the count of write errors is stored in the register, and wherein the controller is further configured to read the register to determine whether the count has reached the threshold.

11. The apparatus of claim 1, wherein the counter accumulates the count of write errors over multiple write operations, and the controller is further configured to read the count after a defined number of write operations have been performed.

12. The apparatus of claim 1, wherein the at least one controller comprises a first controller on a first die that includes the memory array, and a second controller on a second die.

13. The apparatus of claim 1, wherein:
the controller is further configured to determine whether an electrical distance of the memory cell satisfies a condition; and
the count of write errors is incremented further in response to determining that the electrical distance satisfies the condition.

14. The apparatus of claim 13, wherein determining whether the electrical distance satisfies the condition comprises determining whether an address of the memory cell is greater than a threshold value or within a defined address range.

15. The apparatus of claim 13, wherein the electrical distance is an electrical distance from a wordline or bitline driver that applies the pulse.

16. The apparatus of claim 1, wherein applying the at least one pulse comprises:
applying, during a write operation, a first pulse to the memory cell; and
after applying the first pulse, applying a second pulse to the memory cell.

17. The apparatus of claim 1, wherein the controller is further configured to perform write verifications during write operations for the memory cells.

18. The apparatus of claim 16, wherein the memory cell is a phase change memory cell, and the first pulse is used for drift cancellation.

19. The apparatus of claim 16, wherein:
the first pulse has a first polarity;
the second pulse has a second polarity; and
the second polarity is opposite to the first polarity.

20. The apparatus of claim 16, wherein a voltage magnitude of the second pulse is greater than a voltage magnitude of the first pulse.

21. The apparatus of claim 16, wherein the first and second pulses are applied using a wordline and a bitline of the memory array.

22. The apparatus of claim 21, wherein the memory array is a vertical three-dimensional array, and the bitline is a vertical pillar crossing a horizontal plane in which the wordline is located.

23. An apparatus comprising:
a sense amplifier;
a counter;
memory comprising a plurality of memory cells;
access lines; and
control circuitry configured to:
apply, using at least one of the access lines, a voltage to a memory cell;
determine, using the sense amplifier, whether the memory cell reaches a threshold state after applying the voltage;
in response to determining that the memory cell does not reach the threshold state, increment a count using the counter;
read the counter to determine the count; and
based on the determined count, perform at least one action.

24. The apparatus of claim 23, wherein the action includes at least one of:
refreshing the memory cell;
retrying a write operation;
wear leveling;
retirement of a block or other portion of the memory;
write cycle binning in which a selection voltage is increased for at least one bin;
changing a shape for a waveform of a write voltage applied to the memory cells; or
increasing a voltage applied to at least one of a wordline or a bitline used to select the memory cells.

25. The apparatus of claim 23, further comprising a register, wherein:
the count is stored in the register;
reading the counter comprises reading the register; and
the action is performed based on whether the count has reached a threshold.

26. The apparatus of claim 23, wherein determining whether the memory cell reaches the threshold state is only performed if an electrical distance of the memory cell satisfies a condition.

27. The apparatus of claim 26, wherein the condition includes an address of the memory cell being within an address range.

28. A method comprising:
determining whether each of a plurality of memory cells reaches a respective threshold state after applying a voltage;
in response to determining that at least one of the memory cells does not reach the respective threshold state, incrementing a counter;
reading the counter; and
based on reading the counter, performing at least one action.

29. The method of claim 28, wherein reading the counter comprises determining a number of errors that occur over multiple write operations.

30. The method of claim 28, wherein the action includes increasing a voltage applied to at least one of a wordline or bitline used to select memory cells during write operations.

31. The method of claim 28, wherein the plurality of memory cells is accessed using a common address.

* * * * *